United States Patent
Mishra et al.

(10) Patent No.: US 9,485,119 B1
(45) Date of Patent: Nov. 1, 2016

(54) OFFSET CORRECTION FOR SENSE AMPLIFIER

(71) Applicant: Inphi Corporation, Santa Clara, CA (US)

(72) Inventors: Parmanand Mishra, Thousand Oaks, CA (US); Simon Forey, Northamptonshire (GB)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/798,308

(22) Filed: Jul. 13, 2015

(51) Int. Cl.
*H04L 25/03* (2006.01)

(52) U.S. Cl.
CPC ................... *H04L 25/03057* (2013.01)

(58) Field of Classification Search
CPC ........ G01R 27/04; G04B 17/20; H03H 7/30; H03H 7/40; H03K 3/00; H03K 5/156; H03L 7/00; H03L 7/06; H03M 1/12; H03M 9/00; H04B 1/10; H04B 1/38; H04B 11/18; H04L 7/00; H04L 7/033; H04L 25/02; H04L 25/03; H04L 25/03057; H04L 25/03885; H04L 25/49; H04L 27/00; H04L 27/01
USPC ........... 324/638; 327/141, 155; 330/69, 127, 330/254, 304; 341/100–101; 368/219, 221, 368/224, 232, 233, 316, 346, 355, 375, 368/202; 375/219, 221, 224, 232, 233, 316, 375/346, 355, 375
See application file for complete search history.

(56) References Cited

U.S. PATENT DOCUMENTS

| | | | | |
|---|---|---|---|---|
| 8,537,886 B1* | 9/2013 | Su | ................... | H04L 25/03057 375/233 |
| 8,731,031 B1* | 5/2014 | Mishra | ................... | H04L 25/063 375/219 |
| 8,810,319 B1* | 8/2014 | Chan | ................... | H03F 1/42 330/253 |
| 8,861,583 B2* | 10/2014 | Liu | ................... | H04L 25/03885 375/229 |
| 9,172,566 B1* | 10/2015 | Li | ................... | H04L 25/03885 |
| 2014/0152357 A1* | 6/2014 | Zerbe | ................... | H03K 5/1252 327/155 |
| 2014/0362962 A1* | 12/2014 | Meier | ................... | H04L 7/033 375/375 |

* cited by examiner

*Primary Examiner* — Sam K Ahn
*Assistant Examiner* — Shawkat M Ali
(74) *Attorney, Agent, or Firm* — Richard T. Ogawa; Ogawa P.C.

(57) ABSTRACT

The present invention is directed to data communication. More specifically, embodiments of the present invention provide an offset correction technique for a SERDES system. A CTLE module for receiving input data signal is set to an isolation mode, and one or more sense amplifiers perform data sampling asynchronously during the isolation mode. During the isolation mode, CLTE(s) that are not directly connected to the sense amplifiers are shut. Data sampled during the isolation mode are used to determine an offset value that is later used in normal operation of the SERDES system. There are other embodiments as well.

20 Claims, 8 Drawing Sheets

OFFSET CORRECTION FOR SENSE AMPLIFIER

CROSS-REFERENCES TO RELATED APPLICATIONS

N/A

BACKGROUND OF THE INVENTION

The present invention is directed to data communication.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, serializer/deserializer (SERDES) and sense amplifiers are often used.

Over the past, there have been many types of communication systems and methods. Unfortunately, they have been inadequate for various applications. More specifically, sense amplifiers are often inadequate. Therefore, improved systems and methods are desired.

BRIEF SUMMARY OF THE INVENTION

The present invention is directed to data communication. More specifically, embodiments of the present invention provide an offset correction technique for a SERDES system. A CTLE module for receiving input data signal is set to an isolation mode, and one or more sense amplifiers perform data sampling asynchronously during the isolation mode. During the isolation mode, CLTE(s) that are not directly connected to the sense amplifiers are shut. Data sampled during the isolation mode are used to determine an offset value that is later used in normal operation of the SERDES system. There are other embodiments as well.

According to an embodiment, the present invention provides a method for providing offset correction. The method includes processing input signals by an equalizer module, which includes a first CTLE and a second CTLE. The second CTLE is coupled to a first sense amplifier. The input signals are associated with a first sampling rate. The method also includes initiating an isolation mode by shutting off at least the first CTLE and operating the second CTLE in a common mode. The method further includes generating a first equalizer signal by the second CTLE in the isolation mode. The first equalizer signal includes a noise associated with a capacitive coupling effect. The method additionally includes providing a predetermined number of offset samples by sampling the first equalizer signal by the first sense amplifier at a second sampling rate. The second sampling rate is different from the first sampling rate. The method further includes determining a digital offset value based on the predetermined number of offset samples. The method additionally includes initiating an operational mode by setting at least the first CTLE and the second CTLE to operational mode. The method further includes providing a second equalizer signal from the second CTLE. The second equalizer signal is based on output from the first CTEL in the operation mode. The method also includes generating an analog offset signal using at least the digital offset value. The method additionally includes performing sampling by at least the first sense amplifier using at least the second equalizer signal and the analog offset signal at the first sampling rate.

According to another embodiment, the present invention provides a SERDES device that includes an equalizer module, which has a first CTLE and a second CTLE. An output of the first CTLE is connected to the input of the second CTLE. The second CTLE is configured to generate an equalizer output signal from an input signal. The input signal is characterized by a first sampling frequency. The device also includes a digital correction module that is configured to determine and provide an offset correction value. The device further includes a DAC module being configured to generate an offset correction signal, which is determined at an isolation mode. The device also includes a first sense amplifier being configured to generate data samples by sampling the equalizer output signal from the second CTLE at the first sampling frequency using the offset correction signal. The device also includes a detection module configured to determine relative position of the data samples. The device additionally includes a PLL module being configured to provide a clock signal for the first sense amplifier. During the isolation mode, the first CTLE is shut and the second CTLE operates in a common mode and generates a second equalizer output signal. The first sense amplifier generates a predetermined number of samples at a second sampling frequency, which is different from the first sampling frequency. The digital correction module determines the offset correction value using the predetermined number of samples.

According to another embodiment, the present invention provides a SERDES device that includes an equalizer module comprising a first CTLE and a second CTLE. An output of the first CTLE is connected to the input of the second CTLE. The second CTLE is configured to generate an equalizer output signal from an input signal, the input signal being characterized by a first sampling frequency. The device also includes an offset correction module being configured to generate an offset correction signal. The device further includes a data sense amplifier that is configured to generate data samples by sampling the equalizer output signal from the second CTLE at the first sampling frequency using the offset correction signal. The device additionally includes a data sense amplifier that is configured to process the equalizer output signal at the first sampling frequency. The device further includes a detection module configured to determine relative position of the data samples. The device also includes a PLL module being configured to provide a clock signal for the first sense amplifier. During the isolation mode, the first CTLE is shut and the second CTLE operates in a common mode and generates a second equalizer output signal. The first sense amplifier generates a predetermined number of samples at a second sampling frequency. The second sampling frequency is different from the first sampling frequency. The offset correction module determines the offset correction signal using at signal using at least the predetermined number of samples.

It is to be appreciated that embodiments of the present invention provide numerous advantages over existing technology. Compared to conventional techniques and systems, embodiments of the present invention can be implemented efficiently without using expensive (e.g., measured in chip area and power consumption) multiplexers. Additionally, multiplexers used in conventional offset correction systems often add undesirable capacitance and resistance, thereby degrading performance of communication link and effective bandwidth. Embodiments of the present invention uses existing CTLEs and sense amplifiers to isolate noise signal for high speed communication. By eliminating the need of additional components (e.g., CTLEs and sense amplifiers are parts of SERDES systems anyways), undesirable effects of multiplexers and/or other components for offset correction are eliminated. In addition, embodiments of the present invention can be implemented using existing hardware and manufacturing processes with minimal modifications. There are other benefits as well.

The present invention achieves these benefits and others in the context of known technology. However, a further understanding of the nature and advantages of the present invention may be realized by reference to the latter portions of the specification and attached drawings.

DETAILED DESCRIPTION OF THE INVENTION

The present invention is directed to data communication. More specifically, embodiments of the present invention provide an offset correction technique for a SERDES system. A CTLE module for receiving input data signal is set to an isolation mode, and one or more sense amplifiers perform data sampling asynchronously during the isolation mode. During the isolation mode, CLTE(s) that are not directly connected to the sense amplifiers are shut. Data sampled during the isolation mode are used to determine an offset value that is later used in normal operation of the SERDES system. There are other embodiments as well.

As mentioned above, SERDES and sense amplifiers are important components in data communication systems and applications. In data communication applications and implemented in conjunction with SERDES, a sense amplifier is typically used for sampling. For example, sense amplifiers are often implemented as a part of the read circuitry that is used when data is read from the memory. A sense amplifier is typically configured to sense the low power signals from a bit line that represents a data bit (1 or 0), and amplify the small voltage swing to recognizable logic levels so the data can be interpreted properly by logic outside the memory. Performance of sense amplifier is usually measured in speed and accuracy. In the high-speed designs, inputs transistors sizes of sense amplifier are small and optimized for high-speed low-power design. For various implementations, a SERDES often includes both data sense amplifier and edge sense amplifier, which are used for data and edge sampling respectively. More specifically, since sense amplifiers need to support small input voltages, there is little tolerance for mismatches, and offset correction is needed. Offset correction is used to correct the sampler for high receiver sensitivity and to correct data sampling when data are present on the receiver. For example, offset refers to undesired signal that is to be removed by calibration techniques for high speed, low power, and sensitive receivers. For example, offset for sense amplifiers is often associated with capacitive couple effects.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1:
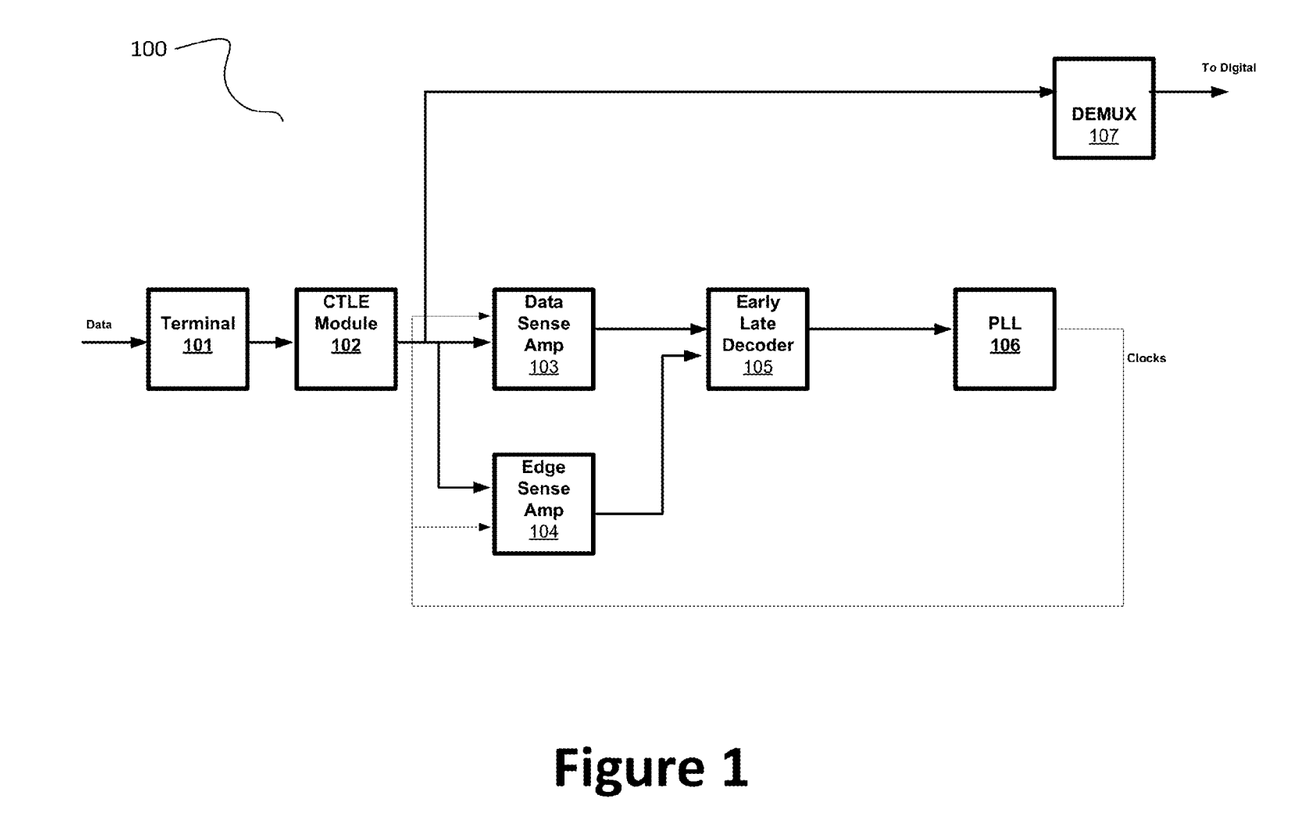
FIG. 1 is a simplified diagram illustrating a SERDES device 100 according to an embodiment of the present invention.

FIG. 1 is a simplified diagram illustrating a SERDES device 100 according to an embodiment of the present invention. This diagram is merely an example, which should not unduly limit the scope of the claims. One of ordinary skill in the art would recognize many variations, alternatives, and modifications. As shown in FIG. 1, device 100 includes a terminal 101 for receiving incoming data. For example, terminal 101 is connected to a data communication link, which may include optical communication link or other types of communication lines. Terminal 101 is connected to the CTLE module 102. For example, the CTLE 102 may be implemented as an equalizer module. Module 102 comprises two or more continuous time linear equalizer (CTLE) units. More specifically, as described below and in FIG. 2, input of a first CTLE is directly coupled to terminal 101, and the output of the first CTLE is coupled to the input of the second CTLE. For example, an "input" of a CTLE typically includes a positive input and a negative input, as a pair of inputs. Similarly, an "output" of a CTLE typically includes a positive output and a negative output, as a pair of outputs. Module 102 is connected to data sense amplifier 103 and edge sense amplifier 104. As mentioned above, sampling typically involves two or more samplers. For example, the data sense amplifier 103 is used for data sampling, and edge sense amplifier 104 is configured for edge sampling. Additionally, module 102 is connected to DEMUX module 107, which provides a digital output. For example, DEMUX module 340 corresponds to DEMUX module 107 in FIG. 1 as a part of the SERDES 100. Data sense amplifier 103 and the sense amplifier 104 are connected to decoder 105. Decoder, or sometimes referred to as "early/late detection module", is configured to determine whether the incoming data is early or late, which is typically measured in phase. For example, the decoder 105 comprises shift detection mechanisms for determining whether the incoming signal is sampled early or late. The decoder 105 is coupled to a phase-lock loop (PLL) module 106. In various embodiments, the PLL module 106 is configured to perform sampling. In various embodiments, the PLL module 106 includes a charge pump, loop filter, voltage controlled oscillator, program delay, and/or other components. The output of the PLL module 105 comprises a clock signal that is provided to data sense amplifier 103 and the edge sense amplifier 104 as shown. In certain implementation, multiple clock signals are provided. As can be seen in FIG. 1, data and edge sense amplifiers, decoder 105, and PLL 106 are arranged as a feedback loop that is configured to determine offset correction needed for the data and edge amplifiers.

Figure 2:
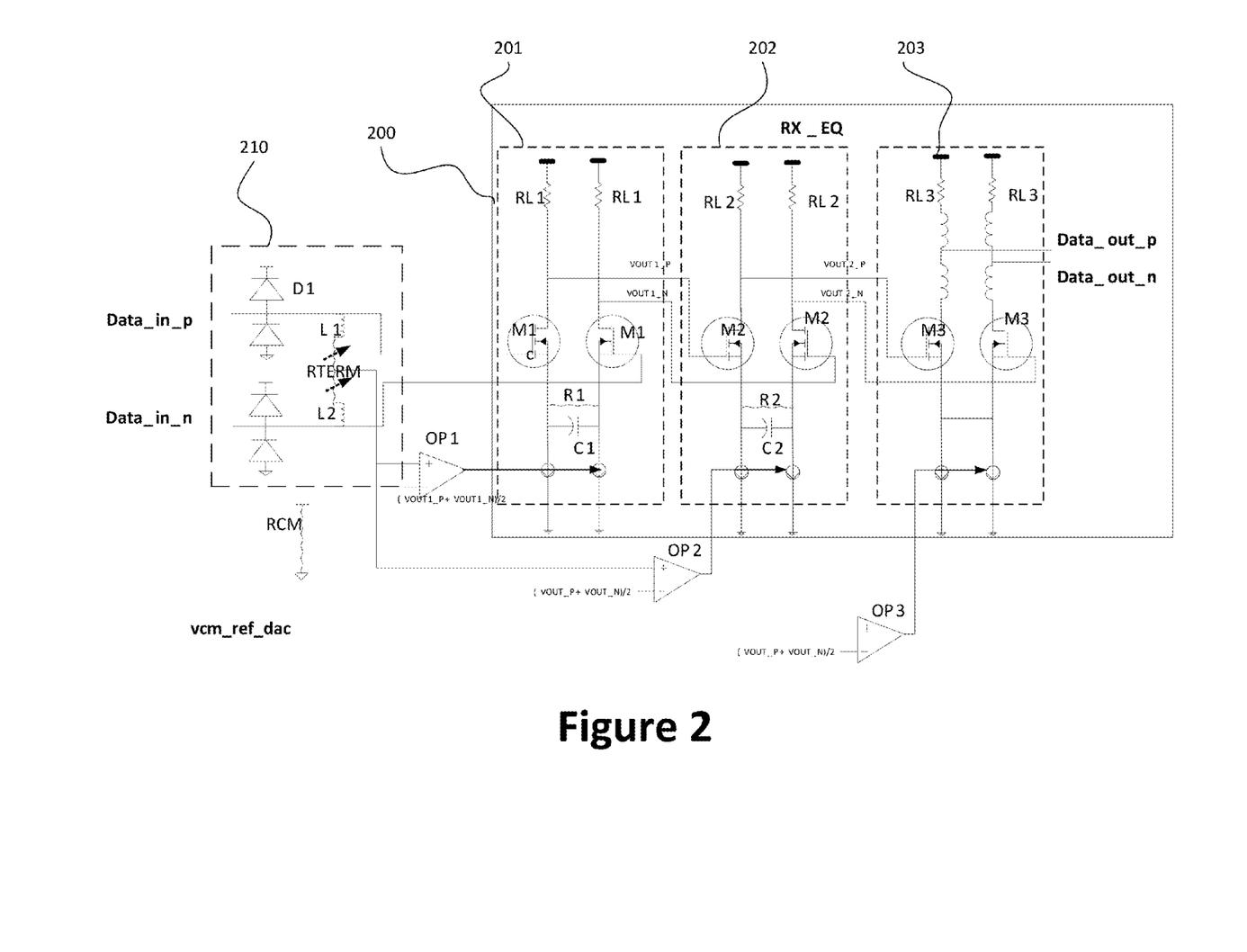
FIG. 2 is a simplified diagram illustrating a CTLE module 200 according to an embodiment of the present invention.

FIG. 2 is a simplified diagram illustrating a CTLE module 200 according to an embodiment of the present invention. This diagram is merely an example, which should not unduly limit the scope of the claims. One of ordinary skill in the art would recognize many variations, alternatives, and modifications. CTLE module 200 includes CLTE 201, CTLE 202, and CTLE 203, and these three CTLEs are connected in series. The CTLE 201 is coupled to terminal 210, which includes a pair of data inputs (data_in_p and data_in_n). The output of CTLE 201, as shown in FIG. 2, is coupled to the input of the CTLE 202, and the output of the CTLE 202 is connected to the CTLE 203. CTLE 203 is the last CTLE in the series configuration, and the output of the CTLE 203 is the output of the CTLE module 200. For example, the output of the CTLE 203 is coupled to sense amplifiers. As mentioned above, the CTLE module 200 includes two or more CTLEs, which are needed to provide offset correction for the sense amplifiers.

Figure 3:
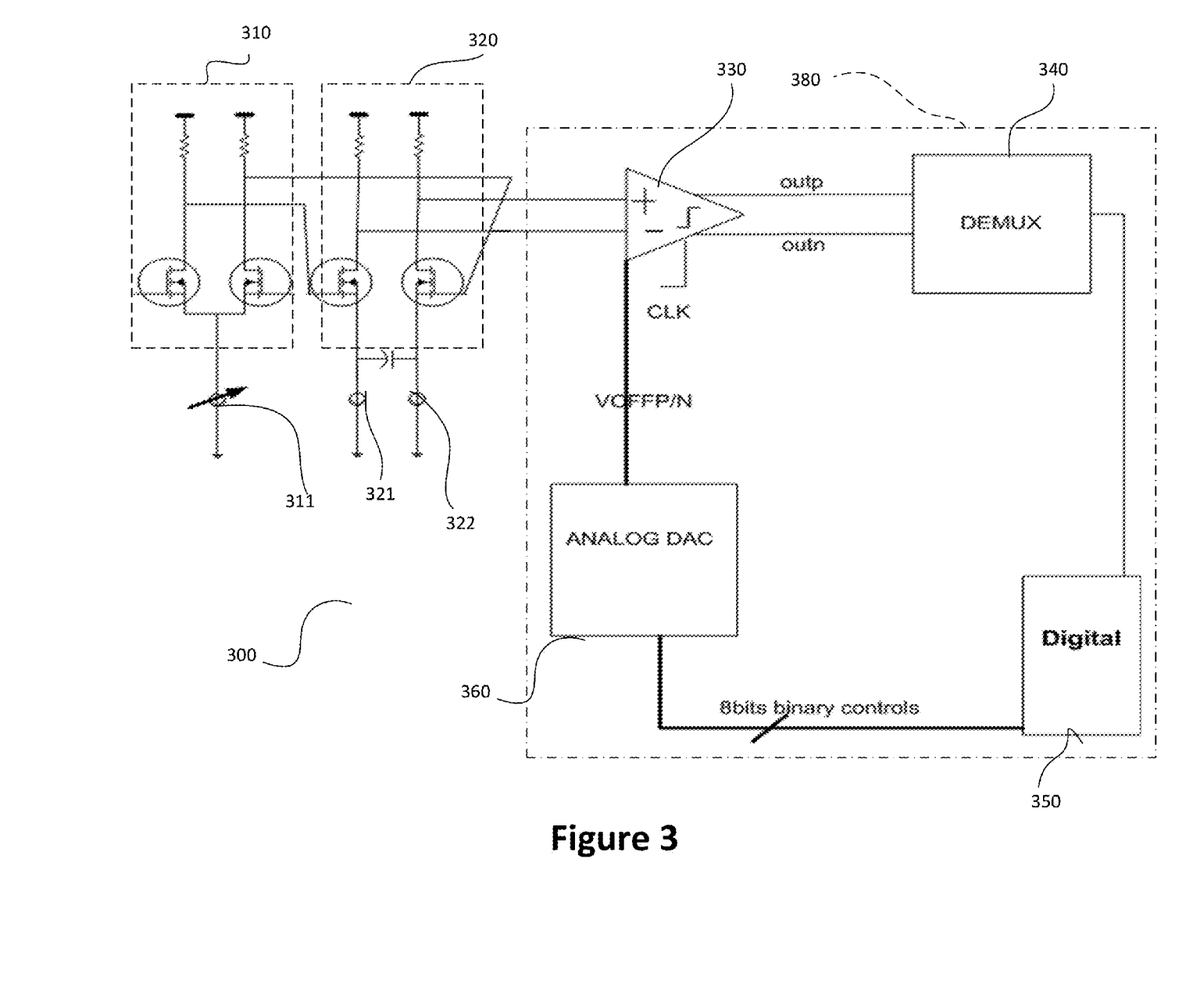
FIG. 3 is a simplified diagram illustrating system 300 for providing offset correction for sense amplifiers according to an embodiment of the present invention.

FIG. 3 is a simplified diagram illustrating system 300 for providing offset correction for sense amplifiers according to an embodiment of the present invention. This diagram is merely an example, which should not unduly limit the scope of the claims. One of ordinary skill in the art would recognize many variations, alternatives, and modifications. As shown in FIG. 3, CTLE 310 is coupled to CTLE 320. For example, CTLE 310 may be connected to another CTLE or input terminal. For example, as shown in FIG. 2, CTLE 310 may be configured as CTLE 202 that is positioned between two CTLEs, or configured as CTLE 201 that is connected directly to terminal 210. CTLE 310 and CTLE 320 perform different functions during the offset correction process. As shown in FIG. 3, CTLE 310 is connected to the ground through switch 311, and CTLE 320 is connected to the ground through switches 321 and 322. CTLE 320 is connected to the feedback loop 380, which provides a mechanism for providing offset correction. The output of the CTLE 320 is connected to the sampler 330. For example, the output of the CTLE 320 is a pair of outputs that is provided to the sampler 330. The sampler 330 processes the output from the CTLE 320 using a clock signal. CTLE 320 generates a pair of outputs, which are outp and outn as shown in FIG. 3. The output of the FIG. 3 is connected to the DEMUX 340, which selectively provides signals to the digital module 350. The digital control module 350 generates control signals based on the signals received from the DEMUX 340. For example, digital control module 350 as shown generates an 8-bits control signal, but it is understood that control signal can be in other formats (e.g., 4-bits, 16-bits, 32-bits, etc.). In a specific embodiment, the digital control module 350 comprises a digital filter for providing offset correction and removing capacitive coupling effects. For example, the control signal from the digital control module 350 is specifically determined to provide offset correction. The DAC module 360 generates an analog offset correction signal (e.g., $V_{OFF}$) based on the control signal generated by the digital control module 350. The offset correction signal from the DAC module 360 is used by the sampler 330, which completes the feedback loop 380.

The operation of the feedback control loop 380 is initiated by entering into an "isolation mode". For offset correction, system 300 operates in an isolation mode. In the isolation mode, CTL 320 operates in common mode, which is set by switches 321 and 322, while other CTLEs (e.g., CTLE 310 and/or other CTLEs that are not directly coupled to the feedback loop 380) are shut. For example, CTLE 310 may be shut by switching off switch 311. Once the CTLE 320 is the isolation mode and CTLE 310 is shut off, CTLE 320 and the feedback control loop 380 effectively form a feedback loop that can be used for offset correction. The output of the sampler 330 during the isolation mode is used to the offset that needs to be corrected. For example, system offset is often attributed to capacitive coupling effected associated with high speed signals. During normal operation, sampler 330 (e.g., sampling using sense amplifiers 103 and 104 in FIG. 1) samples the output of the CTLE 320. In various embodiments, offset calibration process is performed at system startup, and once the offset needed for sense amplifier(s) is determined, the offset correction can be injected compensate the output of CTLE 320 that is used by sampler 330. For example, the amount of offset needed for sense amplifiers is stored by the digital module 350, which generates a control signal that DAC module 360 uses to generate analog offset correctional signal. During normal operation, the analog offset correction signal is used to compensate sense amplifiers. A method for determining the offset correction is described below.

Figure 4:
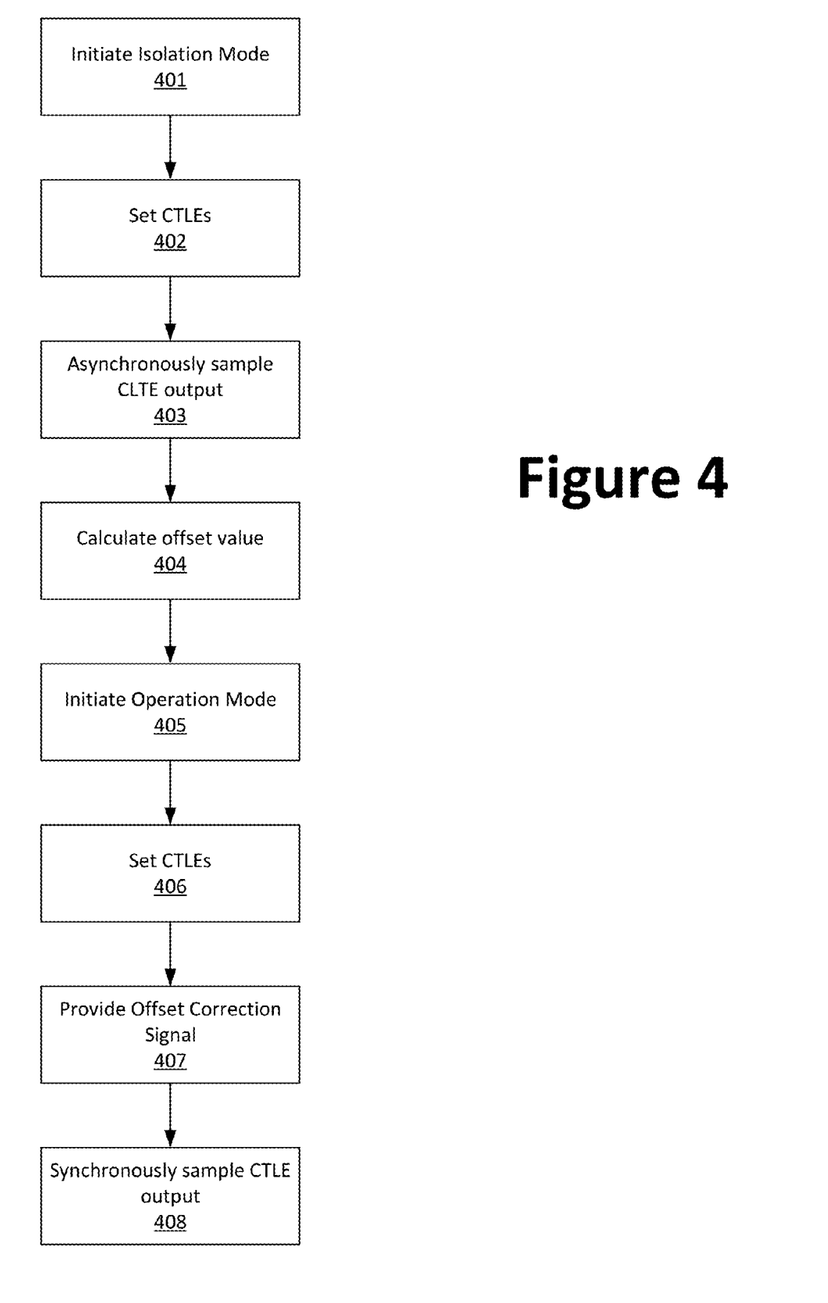
FIG. 4 is a simplified flow diagram illustrating a process for providing sense amplifier offset correction according to an embodiment of the present invention.

FIG. 4 is a simplified flow diagram illustrating a process for providing sense amplifier offset correction according to an embodiment of the present invention. This diagram is merely an example, which should not unduly limit the scope of the claims. One of ordinary skill in the art would recognize many variations, alternatives, and modifications. For example, one or more steps may be added, removed, repeated, replaced, modified, rearranged, and/or overlapped. At step 401, an isolation mode is initiated. As explained above, the isolation mode can be initiated at a part of system (e.g., SERDES system, or communication system as whole) startup process. In certain embodiments, the isolation mode may be initiated in response to poor system performance (e.g., high level of noise), wherein the offset correction needs calibration. At step 402, CTLEs are set for the isolation mode. As explained above, two or more CTLEs are implemented in a SERDES system. The CTLE that is directly connected to the sense amplifier (e.g., CTLE 320 in FIG. 3, or CTLE 203 in FIG. 2) is set to a common mode, and the remaining CTLEs are shut. It is to be appreciated that when the CTLE is operating in the isolation mode, certain types of noise (e.g., capacitive coupling effect) are isolated.

Figure 5:
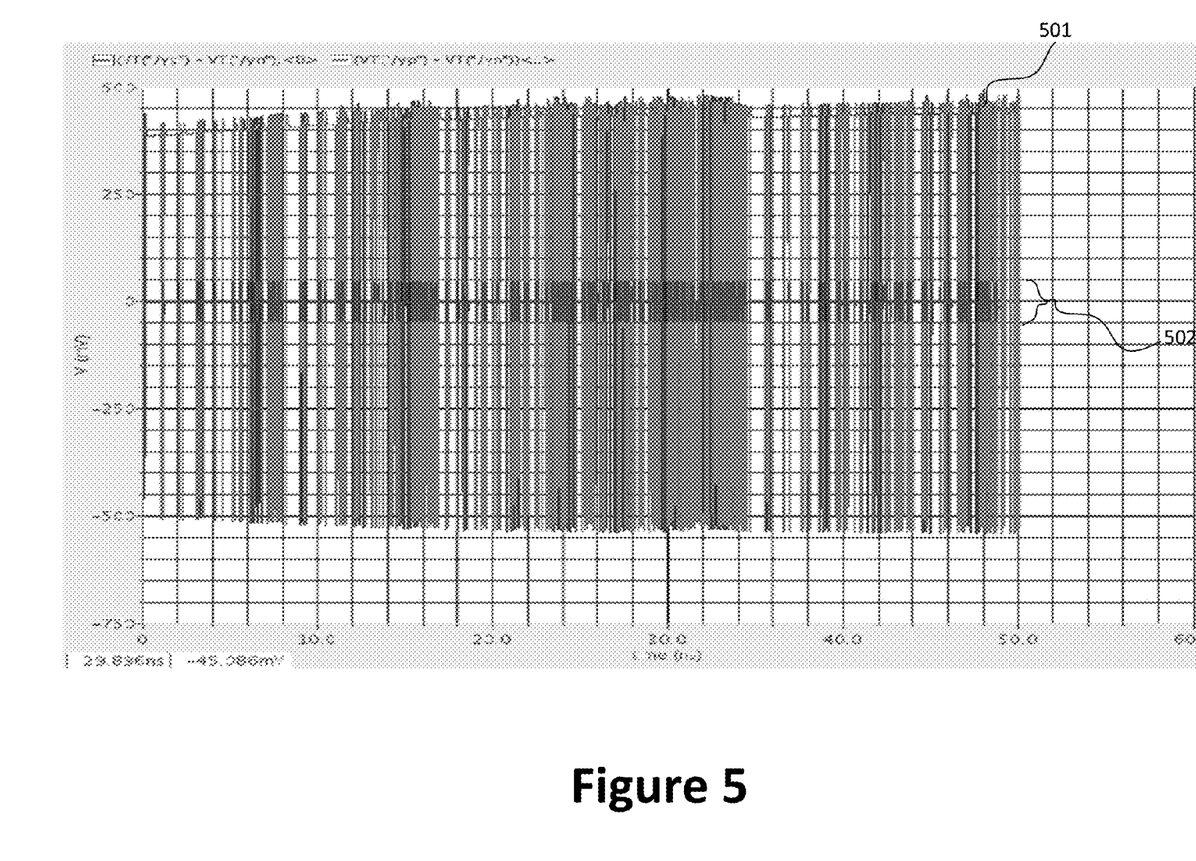
FIG. 5 is a graph illustrating equalizer outputs at different modes according to embodiments of the present invention.
Figure 6:
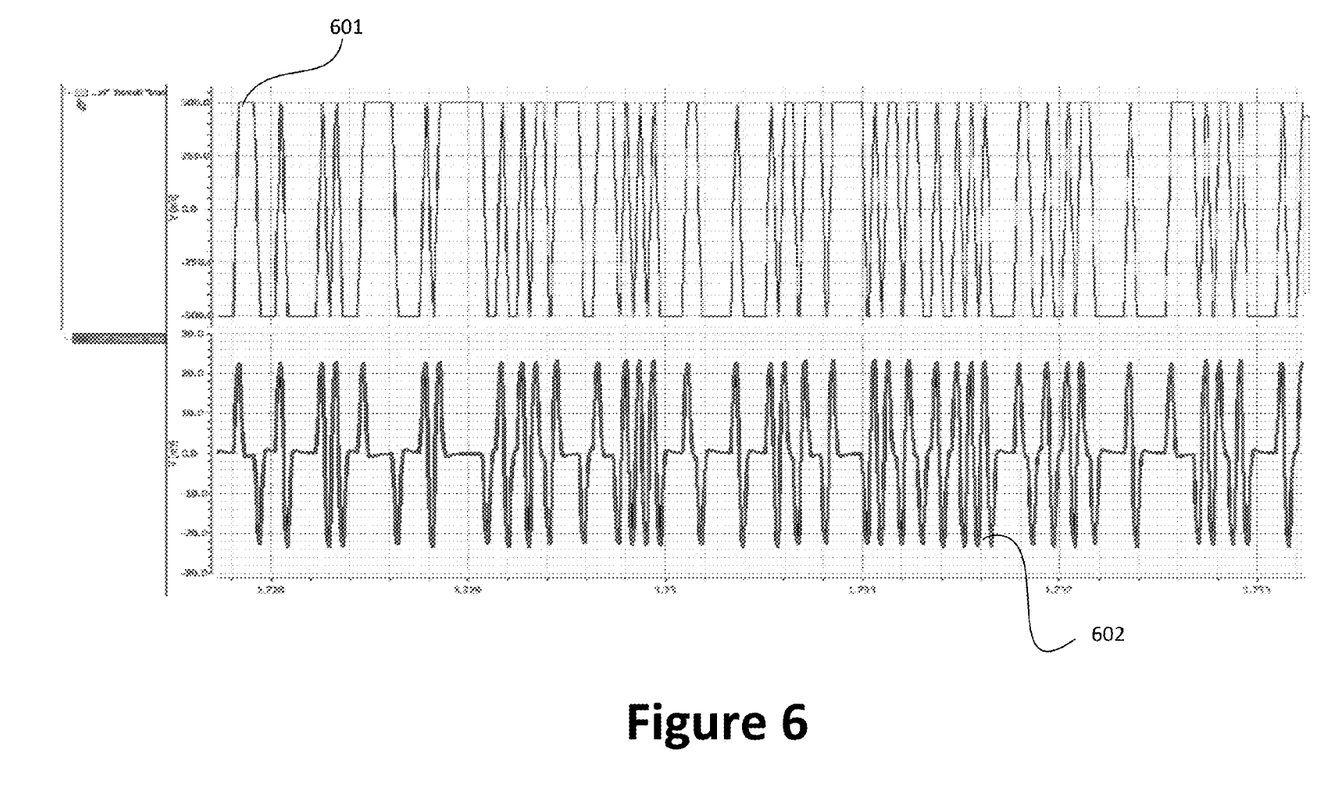
FIG. 6 is a simplified diagram illustrating the output of CTLE compared to its input when operating in the isolation mode according to an embodiment of the present invention.

FIG. 5 is a graph illustrating equalizer outputs at different modes according to embodiments of the present invention. This diagram is merely an example, which should not unduly limit the scope of the claims. One of ordinary skill in the art would recognize many variations, alternatives, and modifications. In FIG. 5, waveform 501 is associated with output from the CTLE operating in normal operation mode, and the voltage swing is 1V peak-to-peak. Waveform 502 is associated with the isolation mode, wherein the peak-to-peak voltage swing is 100 mV. FIG. 6 is a simplified diagram illustrating the output of CTLE compared to its input when operating in the isolation mode according to an embodiment of the present invention. This diagram is merely an example, which should not unduly limit the scope of the claims. One of ordinary skill in the art would recognize many variations, alternatives, and modifications. As can be seen from the graph, signal feedthrough is capacitive. An edge on the incident data waveform 601 gives to a pulse on the output waveform 602. At instances where the incident data waveform 601 does not have an edge, the corresponding output waveform 602 is near zero.

Now referring back to FIG. 4. At step 403, sense amplifiers (e.g., data sense amplifier and edge sense amplifier) perform asynchronous sampling using data received from the CTLE in isolation mode. More specifically, sampling frequency that sense amplifiers use during the isolation mode is specifically selected to be different from the data frequency. For example, sampling frequency is controlled by a clock signal that is controlled by a control module, and the sampling frequency is specifically selected to be different from the data frequency of the input signal once the sense amplifiers and the CTLEs are operating in isolation mode.

Figure 7:
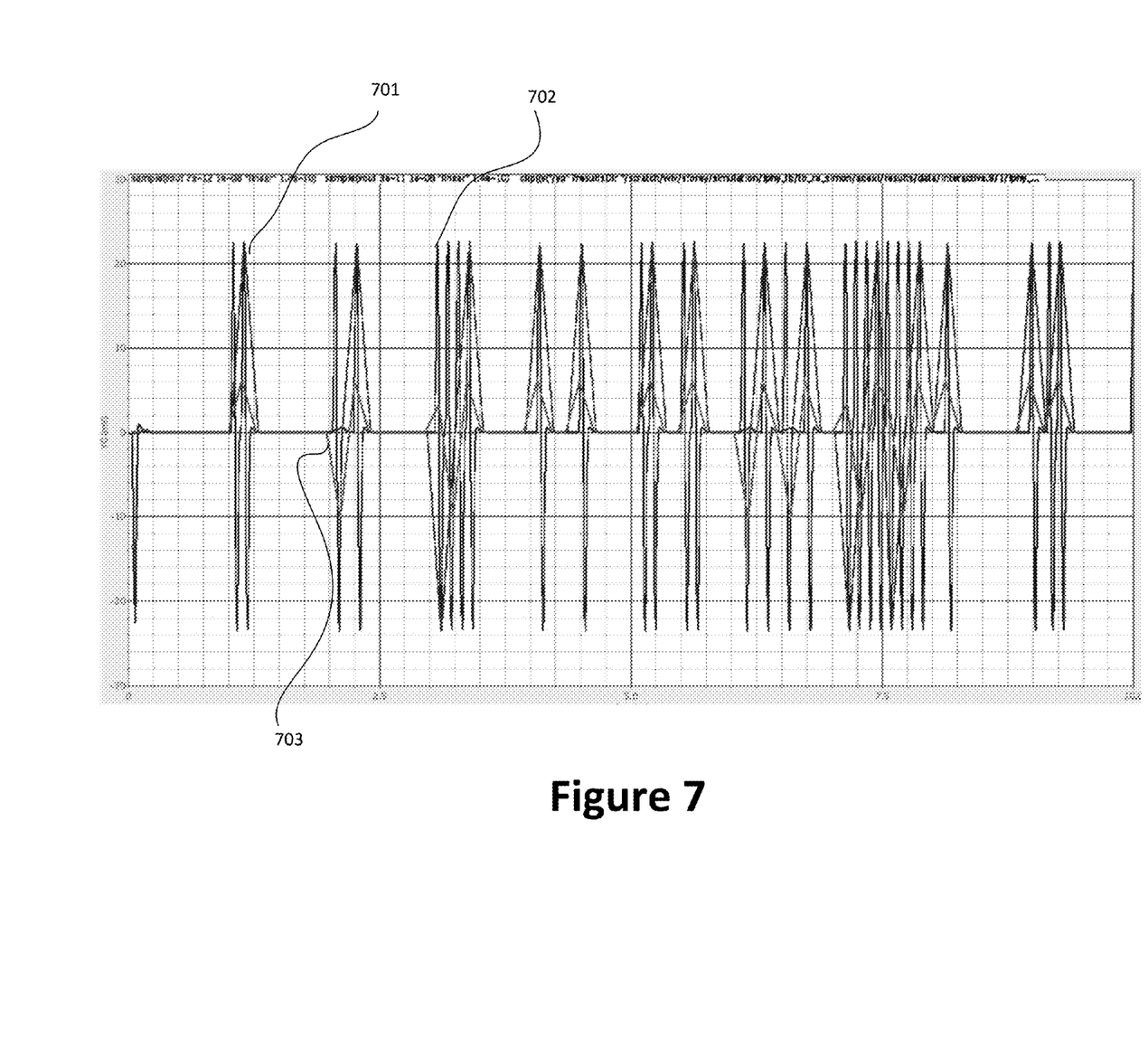
FIG. 7 is a simplified diagram illustrating different selecting sampling frequencies for offset correction according to embodiments of the present invention.

FIG. 7 is a simplified diagram illustrating different selecting sampling frequencies for offset correction according to embodiments of the present invention. This diagram is merely an example, which should not unduly limit the scope of the claims. One of ordinary skill in the art would recognize many variations, alternatives, and modifications. As can be seen in FIG. 7, positions 701, 702, and 703 are associated with different phases of an equalizer (i.e., CTLE) output signal. If the sampling frequency during the isolation mode is the same as (or integer multiple of) the data frequency, sense amplifiers would simply track input signal and obtain data samples at certain phases. However, but selecting a sampling frequency is that different from the data frequency, the asynchronously collected data samples correspond to different phase positions of the input signal, and these data samples a better representation of the noise that needs to be removed.

Figure 8:
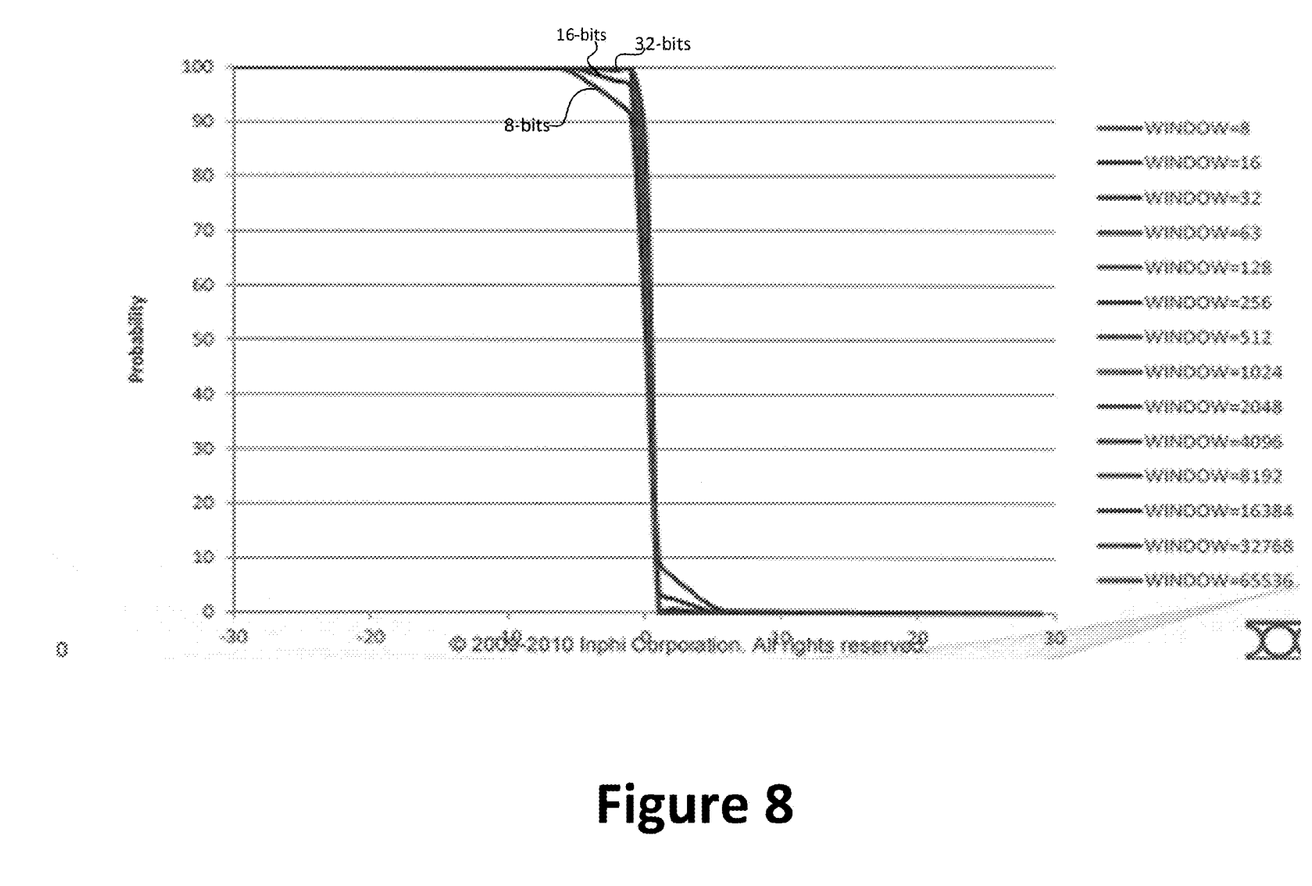
FIG. 8 is a simplified diagram illustrating offset determination process according to embodiments of the present invention.

Now referring back to FIG. 4. At step 404, offset value is calculated. It is to be understood that offset value may include a set of different values. For example, the offset value may be stored digitally (e.g., 8-bits value, 16-bits value, etc.). For example, the offset value may include values for data sense amplifier in edge sense amplifier pair (e.g., offset values for Vn and Vp). Depending on the specific implementation, the offset value can be calculated in different ways. For example, an offset value that correspond the greatest number of "1" in the ramping curve is selected as the offset value. For example, during the process of determining the offset value, different sets of offset values within a predetermined range are tried in a feedback loop to determine which of the offset value provides the greatest gain in performance (e.g., getting a majority of "ones"). It is to be appreciated that a large number of data samples are to be obtained from the sense amplifiers. FIG. 8 is a simplified diagram illustrating offset determination process according to embodiments of the present invention. This diagram is merely an example, which should not unduly limit the scope of the claims. One of ordinary skill in the art would recognize many variations, alternatives, and modifications. As can be seen in FIG. 8, at 8-bits and 16-bits windows (e.g., $2^8$ and $2^{16}$ respectively) are not large enough, which result in the ramping slope. By the time window size reaches 32-bits (e.g., $2^{32}$), the ramping is substantially instantaneous, and window size greater than 32-bits provide relatively small improvement. Thus, for certain implementations, window size is selected at 32-bits, but it is to be understood that other window sizes may be used as well in other implementations.

Now referring back to FIG. 4. Once the offset value is determined, which may be stored digitally, operation mode is initiated, at step 405. For example, the offset value is stored at by a digital control module, which provides the offset value to a DAC module that generates an analog offset correction signal. At step 406, the CTLEs are set to operation mode. More specifically, the CTLEs that were shut during the isolation mode are operational during the operational mode. At step 407, analog offset correction signal is provided to the sense amplifiers. For example, analog offset correction signal may refers to more than one signals (e.g., $V_{OFFP}$ and $V_{OFFN}$) shown in FIG. 3, and data sense amplifier and the edge sense amplifier may use different offset correction signals. At step 408, sense amplifiers perform synchronous sampling using the data signals from the CTLEs and the analog offset correction signal. Depending on the specific implementations, other processes may be performed as well. For example, the sampled data are provided to other components of the SERDES system.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for providing offset correction, the method comprising:

processing input signals by an equalizer module, the equalizer module comprising a first Continuous Time Linear Equalizer (CTLE) and a second CTLE, the second CTLE being coupled to a first sense amplifier, the input signals being associated with a first sampling rate;

initiating an isolation mode by shutting off at least the first CTLE and operating the second CTLE in a common mode;

generating a first equalizer signal by the second CTLE in the isolation mode, the first equalizer signal comprising a noise associated with a capacitive coupling effect;

providing a predetermined number of offset samples by sampling the first equalizer signal by the first sense amplifier at a second sampling rate, the second sampling rate being different from the first sampling rate;

determining a digital offset value based on the predetermined number of offset samples;

initiating an operational mode by setting at least the first CTLE and the second CTLE to an operation mode;

providing a second equalizer signal from the second CTLE, the second equalizer signal being based on output from the first CTLE in the operation mode;

generating an analog offset signal using at least the digital offset value; and performing sampling by at least the first sense amplifier using at least the second equalizer signal and the analog offset signal at the first sampling rate.

2. The method of claim 1 further comprising converting the digital offset value to the analog offset signal by a Digital to Analog Converter (DAC) module.

3. The method of claim 1 further comprising performing sampling by a second sense amplifier using at least the second equalizer signal and the analog offset signal at the first sampling rate.

4. The method of claim 1 wherein the first sense amplifier comprises a data sense amplifier and an edge sense amplifier.

5. The method of claim 1 further comprising performing early/late detection on data sampled by the first sense amplifier at the first sampling rate.

6. The method of claim 1 wherein the first sense amplifier receives a clock signal.

7. The method of claim 1 further comprising shutting off a third CTLE when operating in the isolation mode.

8. The method of claim 1 wherein the predetermined number of offset samples is stored using at least 32-bits of data.

9. The method of claim 1 wherein the sampling at the second sampling rate by the first sense amplifier is asynchronous.

10. The method of claim 1 wherein the first equalizer signal is characterized by a first swing voltage and the second equalizer signal is characterized by a second swing voltage, the second swing voltage being greater than the first swing voltage.

11. The method of claim 1 wherein the second equalizer signal comprises a positive signal and a negative signal.

12. The method of claim 1 wherein the analog offset signal comprises a positive signal and a negative signal.

13. A Serializer Deserializer (SERDES) device comprising:

an equalizer module comprising a first Continuous Time Linear Equalizer (CTLE) and a second CTLE, an output of the first CTLE being connected to an input of the second CTLE, the second CTLE being configured to generate an equalizer output signal from an input signal, the input signal being characterized by a first sampling frequency;

a digital correction module being configured to determine and provide an offset correction value;

a Digital to Analog Converter (DAC) being configured to generate an offset correction signal, the offset correction signal being determined at an isolation mode;

a first sense amplifier being configured to generate data samples by sampling the equalizer output signal from the second CTLE at the first sampling frequency using the offset correction signal;

a decoder configured to determine relative position of the data samples;

a Phase-Lock Loop (PLL) being configured to provide a clock signal for the first sense amplifier;

wherein during the isolation mode:
the first CTLE is shut and the second CTLE operates in a common mode and generates a second equalizer output signal;
the first sense amplifier generates a predetermined number of samples at a second sampling frequency, the second sampling frequency being different from the first sampling frequency;
the digital correction module determines the offset correction value using the predetermined number of samples.

14. The apparatus of claim 13 further comprising a second sense amplifier, wherein the second sense amplifier is an edge sense amplifier.

15. The apparatus of claim 13 further comprising a Demultiplexor (DEMUX) for selecting the data samples from the first sense amplifier.

16. The apparatus of claim 13 wherein the equalizer module further comprising a third CTLE, output of the third CTLE being coupled to an input of the first CTLE, the third CTLE being shut during the isolation mode.

17. The apparatus of claim 13 further comprising a second sense amplifier, wherein the first sense amplifier comprises a data sense amplifier and the second sense amplifier comprises an edge amplifier.

18. A Serializer Deserializer (SERDES) device comprising:

an equalizer module comprising a first Continuous Time Linear Equalizer (CTLE) and a second CTLE, an output of the first CTLE being connected to an input of the second CTLE, the second CTLE being configured to generate an equalizer output signal from an input signal, the input signal being characterized by a first sampling frequency;

an offset correction module being configured to generate an offset correction signal;

a first sense amplifier being configured to generate data samples by sampling the equalizer output signal from the second CTLE at the first sampling frequency using the offset correction signal;

a second sense amplifier being configured to process the equalizer output signal at the first sampling frequency;

a decoder configured to determine relative position of the data samples;

a Phase-Lock Loop (PLL) being configured to provide a clock signal for the first sense amplifier;

wherein during an isolation mode:
the first CTLE is shut and the second CTLE operates in a common mode and generates a second equalizer output signal;
the first sense amplifier generates a predetermined number of samples at a second sampling frequency, the second sampling frequency being different from the first sampling frequency;
the offset correction module determines the offset correction signal using at least the predetermined number of samples.

19. The device of claim 18 wherein the offset correction module comprises a digital correction module.

20. The device of claim 18 wherein the offset correction module comprises a Digital to Analog Converter (DAC).

* * * * *